United States Patent [19]

Hill et al.

[11] 4,005,457
[45] Jan. 25, 1977

[54] SEMICONDUCTOR ASSEMBLY, METHOD OF MANUFACTURING SAME, AND BONDING AGENT THEREFOR

[75] Inventors: Michael Hill, Tarrytown, N.Y.; Josef Intrater, Englewood Cliffs, N.J.; Tugrul Yasar, El Paso, Tex.

[73] Assignee: Semimetals, Inc., Westbury, N.Y.

[22] Filed: July 10, 1975

[21] Appl. No.: 594,707

[52] U.S. Cl. ............................ 357/72; 357/17; 357/65; 357/68

[51] Int. Cl.² .................. H01L 33/00; H01L 23/48; H01L 29/44; H01L 29/48

[58] Field of Search .................... 357/17, 65, 68, 72

[56] References Cited
UNITED STATES PATENTS 3,622,419  11/1971  London et al. ................ 357/72
3,812,406  5/1974  Henri ................................ 357/72
3,930,912  1/1976  Wisbey .............................. 357/71

Primary Examiner—Edward J. Wojciechowicz

[57] ABSTRACT

A semiconductor assembly devoid of wire bonds presents economies of manufacture and is especially suited for light emitting diodes. The semiconductor assembly comprises a semiconductor, an electrode-containing substrate supporting the semiconductor, and an electrode-containing cover supported by the semiconductor. Novel cure-shrinkable adhesive means incorporating an oxide remover (preferably a halogen) physically bonds together the semiconductor and the cover electrode.

27 Claims, 4 Drawing Figures

SEMICONDUCTOR ASSEMBLY, METHOD OF MANUFACTURING SAME, AND BONDING AGENT THEREFOR

BACKGROUND OF THE INVENTION

The present invention relates to semi-conductor assemblies, a method of manufacturing them, and bonding agents useful therefor. More particularly the present invention pertains to light emitting diode assemblies, methods of manufacturing them and bonding agents useful therefor.

In present light emitting diode (hereinafter "LED") assemblies, the N-side of the finished LED chip or die is bonded to a substrate (commonly called a "holder", "header" or "frame") using various metallurgical alloys or conductive epoxies to bond the N-side to the electrode of the substrate. The P-side of the LED chip, where the light is generated, is connected to a cover electrode by various wire bonding techniques, such as thermo-compression and ultrasonic bonding, in such a manner as to minimize obstruction of the P-side and thus permit observation of the emitted light.

The wire bonding of the P-side of the LED chip to the cover electrode is an expensive, low reliability and low yield process. For example, for an eight-digit display there are 64 light emitting segments (7 segments for the numeric portion of each digit and 1 segment for the decimal point portion of each digit) to be wire bonded. The total number of wire-bonding operations required to produce such an eight-digit display is 128, since each wire bond must be connected to the diode and to the cover electrode. The requirement for such a vast number of wire-bonding operations not only increases the cost of manufacturing the display, but also poses reliability problems.

Accordingly, it is an object of the present invention to provide a novel semiconductor assembly devoid of wire bonding.

It is another object to provide such a semiconductor assembly of improved reliability.

It is also an object to provide such a semiconductor assembly for light emitting diodes, the assembly providing improved light output efficiency.

Another object of the present invention is to provide a novel method of manufacturing such semiconductor assemblies which affords economies of manufacture, improved reliability and in the case of light emitting diode assemblies, improved light output efficiency.

A further object is to provide novel bonding agents and techniques for using the same.

SUMMARY OF THE INVENTION

It has now been found that the above and related objects are obtained in a semiconductor assembly devoid of wire bonds. The semiconductor assembly comprises a semiconductor having opposed first and second surfaces, a substrate supporting the semiconductor, and a cover supported by the semiconductor. The substrate includes a first electrode physically bonded to and in electrically conductive contact with the first surface. The cover comprises a non-conductive layer and, on the surface adjacent the semiconductor, a second electrode comprising a pattern of metallization. Adhesive bonding means are provided for physically bonding together the semiconductor and the second electrode in such a manner as to effectively insure the second surface and the second electrode being in electrically conductive contact. The bonding means preferably comprises a cured solution of a cure-shrinkable resin and an oxide remover.

In the LED assembly embodiment of the present invention, the semiconductor is a light emitting diode, the second surface thereof comprising the light emitting surface. In this embodiment, the electrically insulating layer of the cover is light transparent, and the second electrode comprises a pattern of metallization defining a light transparent area aligned with at least a portion of the light emitting surface. Thus light emitted from the light emitting surface of the LED is transmitted to the transparent area and through the transparent insulating cover layer for observation.

In a preferred embodiment, the semiconductor aditionally includes a pattern of metal disposed on the second surface in electrically conductive contact with the second surface and the second electrode. The second electrode may be physically spaced from the pattern of metal disposed on the second surface, in which case the cover additionally includes an electrically conductive layer disposed intermediate the insulating layer and the second electrode and in electrically conductive contact with the second electrode and the pattern of metal disposed on the second surface. In the LED assembly embodiment, this intermediate electrically conductive layer of the cover is, of course, light transmissive.

The oxide remover of the bonding means is preferably a halogen, especially iodine, bromine or a mixture thereof, and the bonding means preferably includes at least 0.5% by weight thereof. The resin is preferably selected from the group consisting of the cyanoacrylate and epoxy resins.

DETAILED DESCRIPTION OF THE PREFERRED EMBODIMENTS

Figure 1:
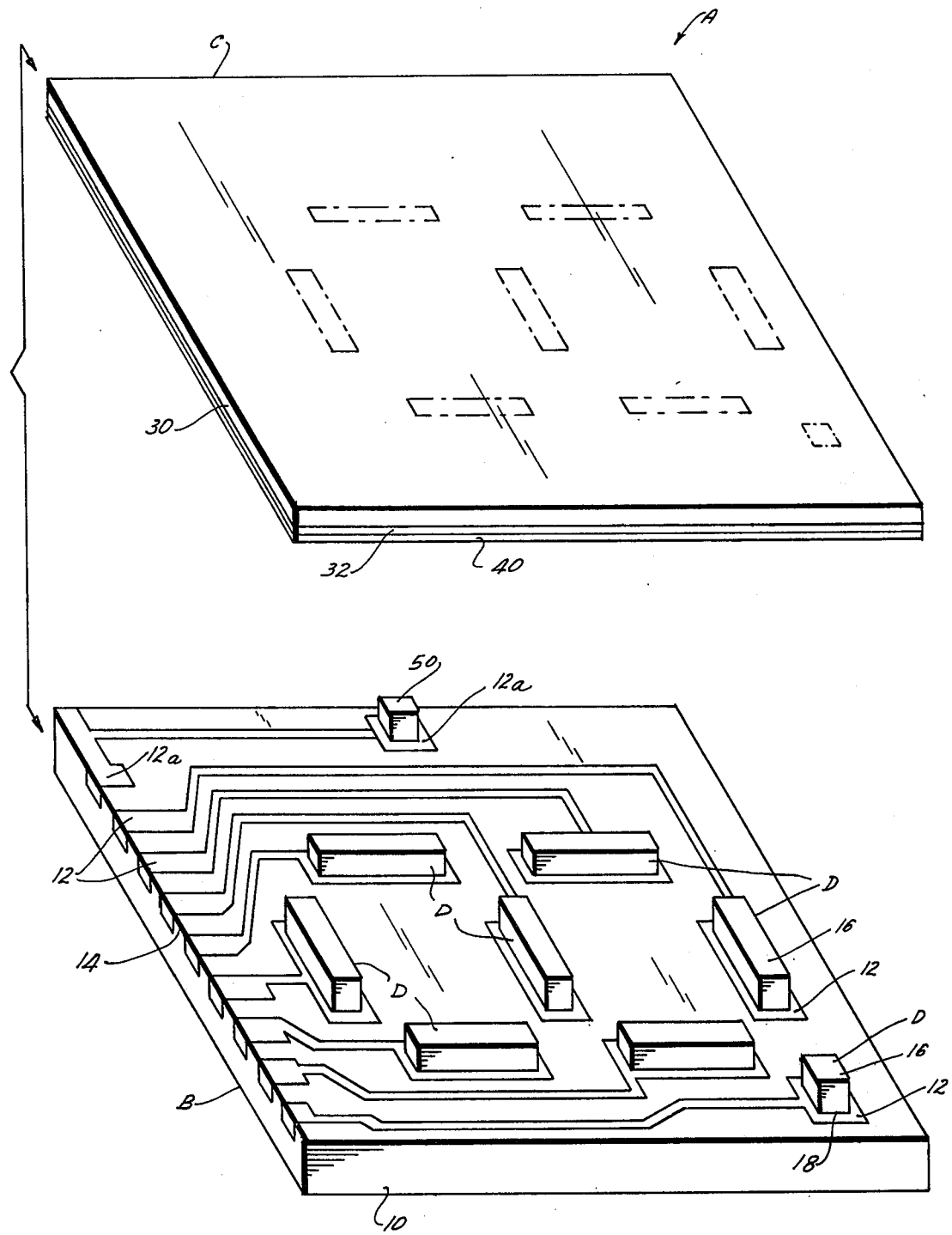
FIG. 1 is an exploded perspective view of a single digit display incorporating eight light emitting diode assemblies according to the present invention, the illuminating areas of the assembly being indicated in phantom line.

Referring now to the drawing, and in particular to FIG. 1 thereof, therein illustrated is a single digit LED display unit A comprising a substrate B, a cover C and eight light emitting diodes D disposed intermediate the substrate B and the cover C in a configuration approximating that of a figure eight followed by a period. Depending upon how many and which of the diodes are excited, any single digit, with or without a decimal point, may be approximated.

The substrate B comprises an electrically insulating layer 10 having a plurality of independent electrodes 12 extending from underneath a respective diode D to and over a common substrate edge 14. Typically the substrate B will be a printed circuit card of the type adapted to be plugged into a connector providing suitable selective electrical energization of the electrodes 12. Other electrode configurations well recognized in the art may similarly be used; for example, instead of each electrode 12 extending to the common edge 14, each electrode 12 may extend vertically from the upper surface of the insulating layer 10 to the bottom surface as an electrical connector pin. Similarly, the insulating layer 10 may be provided with appropriate recesses which receive the electrodes 12 and facilitate the placement and orientation of the electrodes 12 and the diodes D in the desired pattern. The insulating layer 10 is preferably formed of plastic or ceramic, while the electrodes 12 are preferably formed of an alloyed gold. The electrodes 12 may be formed on the insulating layer 10 using techniques well recognized in the semiconductor art, including the silk screen printing of shock film conductive pastes or electroless plating or vacuum metal deposition techniques in conjunction with photolithographic techniques.

A plurality of diodes D are disposed on the upper surface of the substrate B each diode D having its upper or light emitting surface 16 exposed and its lower or non-light emitting surface 18 bonded to and in electrically conductive contact with a respective electrode 12. Various techniques well recognized in the semiconductor art may be used in bonding the light emitting diodes D to the electrodes 12; for example, various conductive epoxy cementing or metallurgical alloy bonding techniques may be employed.

The cover C comprises a light transparent, electrically insulating layer 30 having a common cover electrode 32 disposed on the surface thereof adjacent the diodes D (as illustrated in FIG. 1, the bottom surface thereof). The common electrode 32 comprises a pattern of metallization which may be either light transparent or opaque. (As used herein and in the claims, the term "transparent" is used in contradistinction to the term "opaque" and comprehends within its meaning the term "translucent"). As illustrated, the common electrode 32 is formed of a light transparent material, such as stannic oxide, disposed as a continuous and uninterrupted layer over the entire surface of the insulating layer facing the substrate B. However, as will be seen hereinafter, alternatively the common electrode 32 may be formed of an opaque material, such as aluminum, nickel or gold, in which case the common electrode must define light transparent windows 34 (see FIG. 4), each window 34 being aligned with at least a portion of the light emitting surface of an associated diode D. In either case the pattern of metallization 32 may be easily deposited by known chemical and physical processes such as metal evaporation deposition techniques.

Prior to mounting of the cover C on the diodes D supported by substrate B, cure-shrinkable bonding agent 40 of the type described hereinafter is applied as a continuous thin layer (preferably about one millimeter in thickness) over the surface of the common electrode 32 facing the substrate B. The cover C and substrate B are then aligned and urged towards one another until the light emitting surfaces 16 of the diodes D contact the layer of bonding agent 40 to form an assembly which is then treated so as to effect curing of the bonding agent, typically by heating, exposure to ultraviolet rays, etc. The bonding agent 40 undergoes such a high degree of shrinkage during cure that the quantity of bonding agent 40 initially intermediate the light emitting surface 16 of diode D and the adjacent surface of common electrode 32 is squeezed out to permit a direct physical and electrical contact to be formed between the light emitting surface 16 and the common electrode 32. The bonding agent 40 expressed from between the two substantially planar adjacent surfaces of the common electrode 32 and the light emitting diode D connects the sides of the diode D and the common electrode 32 and, as cure progresses, urges the diode D closer to the common electrode 32 to cause still further expression of the bonding agent 40 until the two surfaces are in direct physical and electrically conductive contact. The bonding agent thus physically bonds together the diodes D and the common electrode 32, with the light emitting surfaces 16 of the diodes D being in electrically conductive contact with the common electrode 32. Also joined in electrical contact with the common electrode 32 in this operation is the upper surface of a conductive block 50 having its lower surface physically bonded to and in electrical contact with an electrode 12a which, like the electrodes 12, is a part of the substrate B and extends over the edge 14 thereof. Thus energization of the single electrode 12a provides through contact block 50 and common electrode 32 a common energization of all of the light emitting surfaces of all of the diodes D. While as a practical matter it is simpler to apply the bonding agent 40 over the entire surface of the common electrode 32 facing the substrate B, it is only essential that the bonding agent 40 be applied on the regions of the common electrode surface aligned with the diodes D and the contact block 50, the common electrode 32 providing the requisite electrical interconnection for the various segments of the bonding agent 40.

It will be noted that where the cover electrode 32 is a continuous uninterrupted and substantially planar light transparent layer devoid of any windows 34 and the light emitting diode surface 16 is also substantially planar (as in FIG. 1), the adhesive bonding means need not be light transparent as the adhesive bonding means will be expressed during cure from between the cover electrode 32 and the light transmitting surface 16 of diode D.

Figure 4:
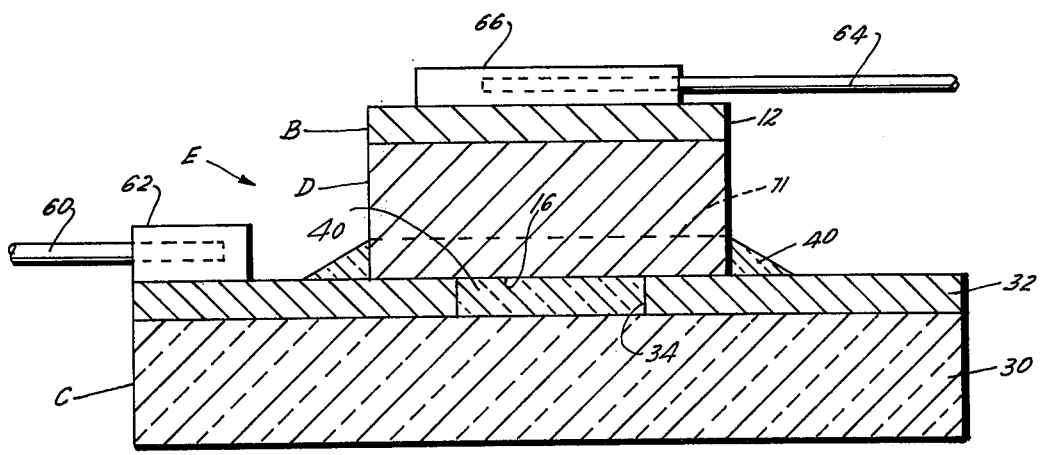
FIG. 4 is an elevation view, in cross section, of a fourth embodiment of a light emitting diode assembly according to the present invention.

Referring now to FIG. 4, therein illustrated is a single light emitting diode assembly E functionally equivalent to that illustrated in FIG. 1 with suitable electrical connections being indicated by an electrical lead 60 connected to the cover electrode 32 by means of an electrically conductive cement block 62 and an electrical lead 64 connected to the substrate electrode 12 by means of an electrically conductive cement block 66. However, in this embodiment the cover electrode 32 comprises a pattern of opaque metallization defining a light transparent window 34 aligned with a portion of the light emitting surface 16 of diode D, and the bonding agent 40—which must be light transparent—is applied only in and about the region of the window 34, either on the electrode 32 of the cover C or on the light emitting surface 16 of the diode D (represented by the portion below the dashed horizontal line 71). Preferably the bonding agent 40 is applied in a quantity sufficient not only to cover the light emitting surface 16 of diode D, but also both to fill the window 34 and, upon expression during curing, to form peripheral bonds between the sides of diode D and the adjacent surface of cover electrode 32. The light transparent bonding agent 40 is preferably selected to provide an index of refraction intermediate the indices of refraction of the diode D and the transparent layer 30 of cover C so that internal reflection of emitted light within window 34 is minimized by the presence therein of the bonding agent 40. Thus the light output of the assembly is maximized by the presence of the bonding agent 40 in the window 34.

The bonding agent 40 preferably includes an aluminum oxide remover which permits a satisfactory electrical connection to be formed between the cover electrode 32 and the light emitting surface 16 of diode D. The cover electrode 32 is preferably formed of aluminum, and it is well recognized in the semiconductor art that even a brief exposure of aluminum to atmospheric conditions suffices to rapidly form a thin, porous but electrically insulating aluminum oxide layer on the surface thereof. So fast is the process of oxide formation that it occurs even in the interval between a conventional oxide removal process and the subsequent bonding operation. Incorporation of the oxide remover into the bonding agent, however, permits the oxide removal and bonding operations to be performed simultaneously with a resultant improvement in the electrical conductivity of the bond between the light emitting surface 16 of the diode D and the cover electrode 32.

Figure 2:
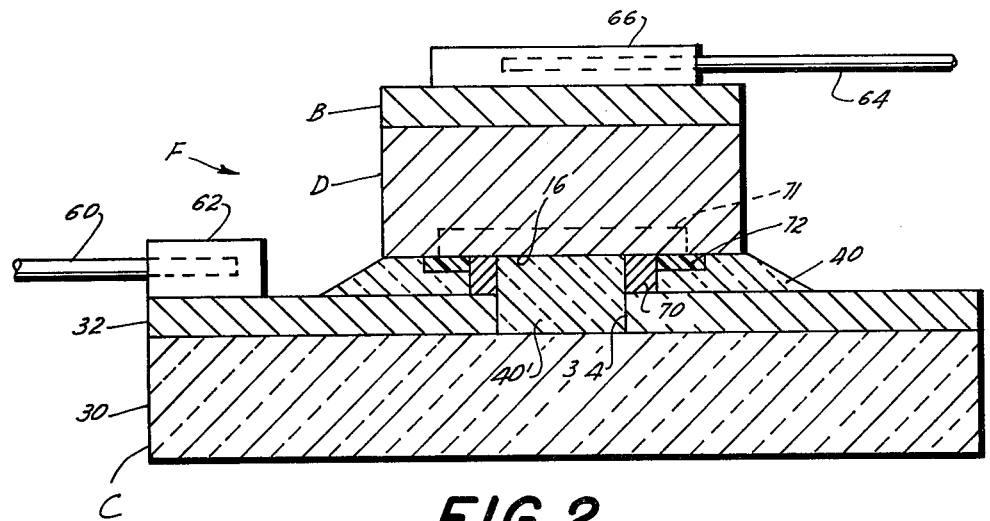
FIG. 2 is an elevation view, in cross section, of a second embodiment of a light emitting diode assembly according to the present invention.

While the embodiments of FIGS. 1 and 4 utilize a direct contact between the cover electrode 32 and the light emitting surface 16 of diode D to provide the electrical connection therebetween, alternative means for providing the electrical connection between the common electrode 32 and the light emitting surface 16 of the diode D may be provided. Referring now to FIG. 2, therein illustrated is a light emitting diode assembly F in which the light emitting surface 16 of diode D and the cover electrode 32 are physically spaced apart and a pattern 70 of metal therebetween provides the requisite electrical connection. Improved electrical contact between the light emitting surface 16 of diode D and the cover electrode 32 results from the metal-to-metal bond formed between the cover electrode 32 and the metal pattern 70 of diode D. When the pattern 70 is formed of alloyed aluminum, the metal-to-metal bond is enhanced in electrical conductivity due to the oxide remover contained in the light transparent bonding agent 40 which removes all the aluminum oxide from both the cover electrode 32 and the pattern 70. While the pattern 70 has been illustrated as a pair of parallel box-like legs, obviously other configurations may also be used.

Merely to illustrate that the principles of the present invention are equally applicable to a diode D with masked as well as full chip diffusion, the diode D of FIG. 2 is illustrated as having undergone diffusion only within and under the dashed line 71 of the diode D, so that the diffused or light emitting surface area of the diode D is less than the full lower diode surface. Although it plays no part in the present invention, small segments 72 of the masking material utilized in the partial chip diffusion operation typically remain on the lower surface of the diode D, spanning the diffused light emitting surface 16 and the non-diffused non-light transmitting surface. The masking agent is typically a light transparent, non-conductive material such as silicon nitride.

Figure 3:
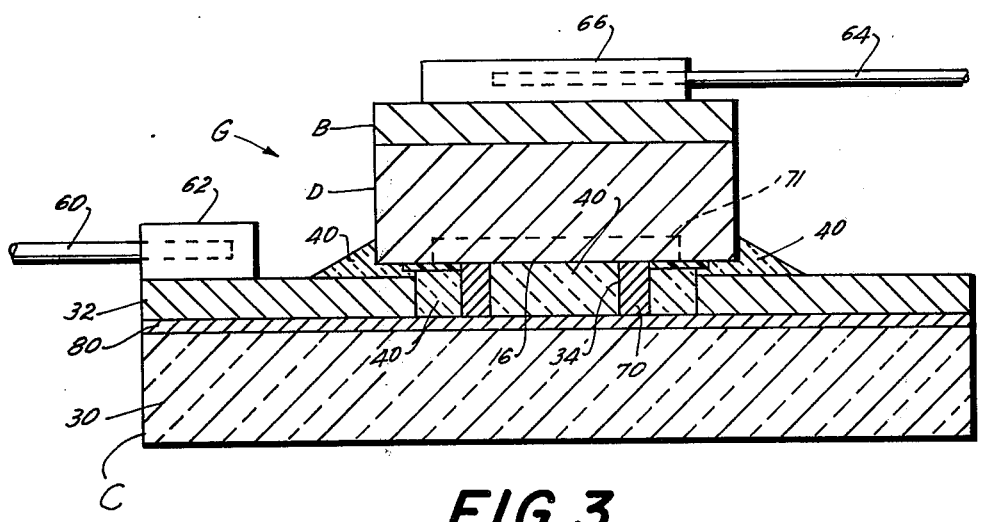
FIG. 3 is an elevation view, in cross section, of a third embodiment of a light emitting diode assembly according to the present invention.

Referring now to FIG. 3, therein illustrated is a light emitting diode assembly G functionally similar to that of FIG. 2, except that the metal pattern 70 is not in direct physical contact with the cover electrode 32. Instead the electrical connection between the metal pattern 70 and the cover electrode 32 is provided by means of a light transparent, electrically conductive layer 80 extending in a plane intermediate the light transparent insulating layer 30 and the cover electrode 32, the layer 80 being in direct physical and electrical contact with the pattern 70 in the region of window 34 as well as the cover electrode 32. The layer 80 may be formed of any light transparent electrically conductive material such as stannic oxide, the material preferably being of low electrical resistance as the layer 80 forms an electrical contact in series between the pattern 70 and the cover electrode 32.

The bonding agent 40 of the present invention comprises a conventional resin-based adhesive which shrinks upon curing. Depending on the resin utilized, the adhesive may be light transparent or opaque. The adhesive is preverably one which has a long working time, cures rapidly (typically by a controlled polymerization) and is not susceptible to attack by environmental elements such as oxygen and water vapor. Suitable light transparent, cure-shrinkable resin-based adhesives include the cyanoacrylates and epoxy-based adhesives well known to those in the adhesive art. Incorporated in the bonding agent is an oxide remover, preferably a halogen. The halogen comprises at least 0.5% by weight of the total bonding agent, but should be maintained at a level below that at which the presence of the halogen might adversely affect the performance of the resin-based adhesive. Although all halogens are effectively in the bonding agent of the present invention, the preferred halogens are iodine, bromine or mixtures thereof due to their inexpensiveness, low toxicity and ease of handling relative to the other halogens.

A preferred light transparent cure-shrinkable bonding agent is formulated by mixing a saturated iodine solution and an epoxy resin available from Eastman Kodak under the trade name "EASTMAN 910". The iodine solution is prepared by warming isopropyl alcohol to 5° C below its boiling point and adding iodine crystals, with stirring, until the crystals no longer dissolve. The solution is then filtered to remove any non-dissolved iodine crystals. The filtered iodine solution is then mixed with the adhesive, one part by volume of iodine solution to nine parts by volume of adhesive, to form a light transparent bonding agent according to the present invention. For best results, the bonding agent should be utilized within an hour of the preparation of the iodine solution. The bonding agent is preferably used at ambient temperature (25° C ± 5° C), and a relative humidity of less than 75%. At room temperature, the bonding agent initially sets within three minutes and reaches a full strength bond within 24 hours. Alternatively, the bonding agent may be applied at room temperature and then heated to 75°–100° C, the bonding agent initially setting at the elevated temperature in one minute and reaching a full strength bond in 30 minutes.

The exact mechanism by which the oxide remover operates is not known with certainty. However, it is theorized that the oxide remover penetrates the porous oxide layer and corrosively reacts with the underlying aluminum to form various compounds (e.g., $AlX_2$, $Al_2X_3$ and $AlX_3·6H_2O$, where X represents the halogen). The formation of these compounds results in dimensional variations in the surface underlying the aluminum oxide layer, and the dimensional variations in turn cause the oxide layer to break up into small segments. These segments become dispersed in the bonding agent and are eventually expressed from the area of electrical contact with the bonding agent. While it is possible that some of the oxide layer segments remain in the area of electrical contact, the experimentally proven fact is that they do not preclude the formation of an effective electrical contact with the aluminum surface.

The bonds formed with the bonding agent of the present invention show essentially no deterioration with age. Life tests conducted on light emitting diode assemblies fabricated with the bonding agent of the present invention indicated only negligible changes in the minimum voltage and light output over prolonged periods of time at ambient (25° C) and elevated (100° C) temperatures, the test results being tabulated in Table I.

TABLE I

| 25° C | | Start | End | Change | Period |
|---|---|---|---|---|---|
| | Forward Voltage, volts | 1.70 | 1.76 | 0.06 | 1600 hrs. |
| | Light output* | 1.07 | 1.06 | 0.01 | 1300 hrs. |
| 100° C | | | | | |
| | Forward Voltage, volts | 1.70 | 1.68 | 0.02 | 1600 hrs. |
| | Light output* | 0.278 | 0.303 | 0.025 | 1300 hrs. |

*Arbitrary units measured at a forward current of 30 millamperes D.C.

While the present invention has been shown and described in terms of a light emitting diode assembly, it will be obvious to those skilled in the art that the operative principles of the present invention apply with equal vigor to other semiconductor components. Where the semiconductor is not light emitting, obviously there is no requirement that any of the assembly components described hereinabove as "light transparent" be light transparent, although they may be if so desired.

Thus, applicants have invented a semiconductor assembly which does not require wire bonded contacts and provides improved electrical and mechanical characteristics.

Now that the preferred embodiments of the present invention have been shown and described in detail, various improvements and modifications thereon will be readily apparent to those skilled in the art. Accordingly, the spirit and scope of the present invention is to be limited only by the appended claims, and not by the foregoing disclosure.

We claim:
1. A semiconductor assembly comprising
  A. a semiconductor having opposed first and second surfaces;
  B. a substrate supporting said semiconductor, said substrate including a first electrode bonded to and in electrically conductive contact with said first surface;
  C. a cover supported by said semiconductor, said cover comprising an electrically insulating layer and a second electrode comprising a pattern of metallization disposed on the surface of said insulating layer adjacent said semiconductor; and
  D. cure-shrunk adhesive bonding means physically bonding together said semiconductor and said second electrode, with said second semiconductor surface and said second electrode in electrically conductive contact, said semiconductor and said second electrode being bonded together essentially exclusively by said adhesive bonding means.

2. The assembly of claim 1 wherein said semiconductor additionally includes a pattern of metal disposed on said second semiconductor surface in electrically conductive contact with said semiconductor surface and said second electrode.

3. The assembly of claim 2 wherein said pattern of metal disposed on said second semiconductor surface comprises a pattern of alloyed aluminum having a thickness not less than that of said second electrode.

4. The assembly of claim 2, wherein said second electrode is physically spaced from said pattern of metal disposed on said second semiconductor surface, and wherein said cover additionally includes an electrically conductive layer intermediate said insulating layer and said second electrode and in electrically conductive contact with said second electrode and said pattern of metal disposed on said second semiconductor surface.

5. The assembly of claim 1 wherein said semiconductor is a light emitting diode, said second surface comprises the light emitting surface of said diode; said insulating layer of said cover is light transparent; said second electrode comprises a pattern of metallization defining a light transparent area aligned with at least a portion of said light emitting surface.

6. The assembly of claim 5 additionally including a light transparent electrically conductive layer disposed intermediate said insulating layer and said second electrode and extending beyond said pattern of metallization on said insulating surface and into said light transparent area.

7. The assembly of claim 5 wherein said second electrode comprises a pattern of opaque metallization defining said light transparent area and said adhesive bonding means is light transparent.

8. The assembly of claim 1 wherein said second electrode comprises an evaporated metal selected from the group consisting of aluminum, nickel and gold.

9. The assembly of claim 1 wherein said adhesive bonding means comprises a cured solution of:
  A. a resin which shrinks upon curing; and
  B. an oxide remover.

10. The assembly of claim 9 wherein said oxide remover is a halogen.

11. The assembly of claim 10 wherein said halogen is selected from the group consisting of bromine, iodine and mixtures thereof.

12. The assembly of claim 10 wherein said bonding means includes at least 0.5% by weight of said halogen.

13. The assembly of claim 9 wherein said resin is selected from the group consisting of cyanoacrylate and epoxy resins.

14. A light emitting diode assembly comprising:
  A. a light emitting diode semiconductor having opposed first and second surfaces, said second surface comprising a light emitting surface;

B. a substrate supporting said semi-conductor, said substrate including a first electrode bonded to and in electrically conductive contact with said first surface;

C. a cover supported by said semiconductor, said cover comprising a light transparent electrically insulating layer and a second electrode comprising a pattern of metallization disposed on the surface of said insulating layer adjacent said semiconductor and defining a light transparent area aligned with at least a portion of said light emitting surface; and D. adhesive bonding means physically bonding together said semiconductor and said second electrode, with second semiconductor surface and said second electrode in electrically conductive contact, said semiconductor and said second electrode being bonded together essentially exclusively by said adhesive bonding means.

15. The assembly of claim 14 wherein said semiconductor additionally includes a pattern of metal disposed on said second semiconductor surface in electrically conductive contact with said second semiconductor surface and said second electrode, and wherein said adhesive bonding means is light transparent.

16. The assembly of claim 15 wherein said pattern of metal disposed on said second semiconductor surface comprises a pattern of alloyed aluminum having a thickness not less than that of said second electrode.

17. The assembly of claim 15, wherein said second electrode is physically spaced from said pattern of metal disposed on said second semiconductor surface, and wherein said cover additionally includes a light transparent electrically conductive layer intermediate said insulating layer and said second electrode and in electrically conductive contact with said second electrode and said pattern of metal disposed on said second semiconductor surface.

18. The assembly of claim 17 wherein said light transparent electrically conductive layer disposed intermediate said insulating layer and said second electrode extends beyond said pattern of metallization on said insulating surface and into said light transparent area.

19. The assembly of claim 17 wherein said second electrode comprises a pattern of opaque metallization defining said transparent area.

20. The assembly of claim 14 wherein said adhesive bonding means is light transparent, is disposed at least in part intermediate said light emitting surface of said semiconductor and said light transparent layer of said cover, and has an index of refraction intermediate those of said light emitting surface and said light transparent layer.

21. The assembly of claim 14 wherein said second electrode comprises an evaporated metal selected from the group consisting of aluminum, nickel and gold.

22. The assembly of claim 14 wherein said adhesive bonding means comprises a cured solution of:
A. a resin which shrinks upon curing, and
B. an oxide remover.

23. The assembly of claim 22 wherein said oxide remover is a halogen.

24. The assembly of claim 23 wherein said halogen is selected from the group consisting of bromine, iodine and mixtures thereof.

25. The assembly of claim 23 wherein said bonding means includes at least 0.5% by weight of said halogen.

26. The assembly of claim 22 wherein said resin is selected from the group consisting of cyanoacrylate and epoxy resins.

27. The assembly of claim 22 wherein said adhesive bonding means is light transparent.

* * * * *